(12) United States Patent
Van Gennip

(10) Patent No.: US 7,618,290 B2
(45) Date of Patent: Nov. 17, 2009

(54) STARTER HOUSING FOR GAS DISCHARGE LAMP, AND METHOD OF MOUNTING SAME

(75) Inventor: Nicasius Gerardus Tielemanus Van Gennip, Heeze (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 608 days.

(21) Appl. No.: 10/578,074

(22) PCT Filed: Oct. 27, 2004

(86) PCT No.: PCT/IB2004/052215

§ 371 (c)(1),
(2), (4) Date: May 3, 2006

(87) PCT Pub. No.: WO2005/045878

PCT Pub. Date: May 19, 2005

(65) Prior Publication Data

US 2007/0133149 A1    Jun. 14, 2007

(30) Foreign Application Priority Data

Nov. 7, 2003   (EP) .................................. 03104121

(51) Int. Cl.
*H01R 13/648* (2006.01)
(52) U.S. Cl. .................................. 439/607.27; 439/577
(58) Field of Classification Search ................. 439/607, 439/577, 608–610, 607.27, 607.01; 362/646, 362/221, 265
See application file for complete search history.

(56) References Cited

U.S. PATENT DOCUMENTS

| | | | | |
|---|---|---|---|---|
| 4,384,316 A * | 5/1983 | de Vos et al. | ................. | 362/147 |
| 4,739,188 A * | 4/1988 | DeCandia et al. | ........... | 307/149 |
| 6,074,263 A * | 6/2000 | Sanders et al. | ................. | 445/23 |
| 6,123,435 A * | 9/2000 | Wang | .......................... | 362/263 |
| 6,190,191 B1 * | 2/2001 | Pasternak | .................... | 439/236 |
| 6,810,299 B2 * | 10/2004 | Nakamura | .................. | 700/121 |
| 7,201,491 B2 * | 4/2007 | Bayat et al. | .................. | 362/171 |
| 7,240,508 B2 * | 7/2007 | Park | ............................ | 62/298 |

\* cited by examiner

*Primary Examiner*—Gary F. Paumen

(57) ABSTRACT

A starter housing (1) for a gas discharge lamp (3) is described. The starter housing (1) comprises an outer (5) and an inner housing (10) which are arranged one inside the other in an assembled state of the starter housing (1), of which the outer housing (5) has a metal layer for electromagnetic screening. The starter housing (1) in addition comprises an inner housing tube (11) at its inner housing (10), which is surrounded in the assembled state by an outer housing tube (8) arranged at the outer housing (5), such that the inner housing tube (11) and the outer housing tube (8) together form a socket (4). Reference elements (13; 14) are provided at the tubes (8; 11) of the two housings (5; 10) such that they co-operate in the assembled state for defining the positions of the two tubes (8; 11) with respect to one another. Furthermore, a method of mounting such a starter housing (1) is disclosed.

9 Claims, 4 Drawing Sheets

STARTER HOUSING FOR GAS DISCHARGE LAMP, AND METHOD OF MOUNTING SAME

Figure 1:
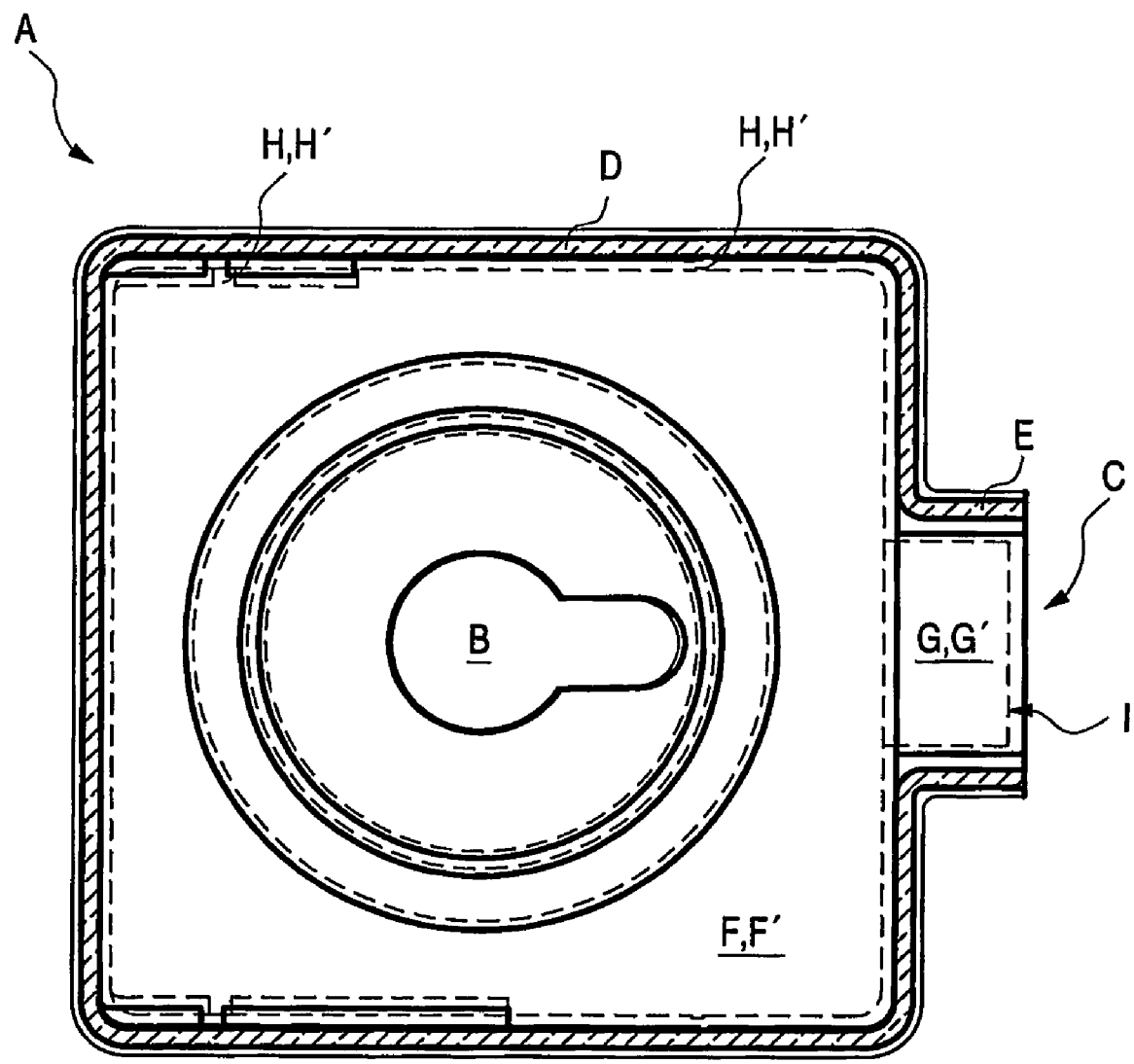

The invention relates to a starter housing for a gas discharge lamp, in particular for motor vehicles, with an outer and an inner housing, one arranged inside the other in an assembled state of the starter housing, of which the outer housing comprises a metal layer for electromagnetic screening of the inner housing, and with an inner housing tube at the inner housing which in the assembled state is surrounded by an outer housing tube arranged at the outer housing, said inner housing tube and outer housing tube together forming a plug-in socket.

Gas discharge lamps, for example so-termed HID (High Intensity Discharge) lamps such as, for example, high-pressure sodium lamps, and in particular MPXL (Micro Power Xenon Light) lamps operating with a xenon gas filling, have been used with increasing frequency in the motor vehicle lamp industry during the past few years because of their excellent luminous efficacy and long life. An electronic starter circuit is necessary for the operation and here in particular for a starting phase of these lamps, which circuit is arranged in a housing adjacent the lamp, preferably at or in its lamp base, and is connected thereto.

Both the gas discharge lamp and the associated electronic circuit emit an electromagnetic radiation as a result of their construction. This radiation may lead to electromagnetic interference with other electronic units such as, for example, an audio set, an ABS, an airbag control of a motor vehicle, and accordingly to malfunctions of the relevant devices. Therefore, there are statutory EMC (electromagnetic compatibility) specifications and comparatively stringent EMC requirements imposed by the automobile industry itself, for example CISPR25, for screening this interfering radiation. It is accordingly strictly necessary to use constructional means for protecting the motor vehicle electronics from the undesirably radiated electromagnetic energy.

A possibility of reducing this radiation is found in that the starter housing is provided with an electromagnetic screening which surrounds the entire housing contents. It is usually made of metal and may be constructed inter alia as a grating or as a closed surface. The screening may be provided, for example, as a thin layer on a carrier material, for example vapor-deposited, or it may form a separate outer housing around an inner housing.

To supply the lamp with current, a plug-in socket, usually surrounded by a metal screening as is the starter housing itself, is formed at this starter housing. It forms an interface where the supply and return leads of the current supply of the lamp are contacted while also as large as possible a contacting of the screening is achieved. Besides the contacts inside the plug-in socket, therefore, the screening of the plug-in socket itself forms a contact surface against which the screening of the associated plug and its supply line is contacted.

A known starter housing substantially comprises a synthetic resin inner housing which accommodates the circuitry and which is surrounded by a two-part metal housing serving as a screening and consisting of a lower housing part and a cover. The associated plug-in socket is formed by a synthetic resin inner part, which projects beyond a sidewall of the inner housing and is surrounded by a screening metal sleeve which is formed integrally with at least one of the two parts of the metal housing. The components of such a starter housing can be inexpensively manufactured. Thus the inner housing may be formed as a synthetic resin injection-molded part, and the two components of the metal housing may be manufactured in a deep-drawing process. The two houses may be assembled together in a mechanized process. The inner housing is for this purpose inserted into the lower housing part. The former comprises ridges extending in the insertion direction on mutually opposed side surfaces, the height of which ridges increases such that the associated side walls of the lower housing part are pressed slightly outwards. These ridges serve to center the inner housing in the lower part and provide a press fit of the inner housing in the lower part. The cover is subsequently put thereon. Its edge grips over the side edges of the lower part and has locking elements. It is locked in mating locking elements at the upper edge of the slightly spread side walls. The inner housing is thus immovably held in the outer housing, which in its turn is fixedly closed.

In this embodiment of the starter housing, the problem arises that manufacturing tolerances of the injection-molding and deep-drawing processes render it impossible accurately to observe the dimensions required for a reliable contacting of the plug in the socket. Given an unfavorable addition of the tolerances, it may occur that the metal tube passes beyond the synthetic resin inner part at an insertion side of the socket and thus hampers a reliable contacting of the plug in the socket, for example a snug contact of the plug against a contact surface of the synthetic resin inner part at its insertion side.

It is accordingly an object of the present invention to provide a starter housing whose assembly can take place in a mechanized manner and in which narrow tolerances with respect to the plug are observed.

This object is achieved by means of a starter housing of the kind mentioned in the opening paragraph, wherein reference elements are arranged at the respective tubes of both housings such that they co-operate in the assembled state for defining the positions of the two tubes with respect to one another. The term "tube" of a respective housing here denotes a housing part whose outer surface surrounds an inner space for the plug contacts while forming a plug-in socket housing part, which inner space extends from a first end surface, which is adjacent a wall of the relevant housing or coincides therewith, substantially perpendicularly away from the housing outer side towards a second end. The second end, i.e. the plug-in side of the socket, has an opening which allows the insertion of a plug into the inner space of the tube so a to make contact with the contact elements arranged therein.

The invention accordingly departs from the construction of the starter housing usual until now, wherein the inner housing is centrally clamped in the outer housing. This is because, for example, shrinkage may occur in the manufacture of the inner housing, the extent of which is difficult to determine beforehand and which affects the entire inner housing and cannot be avoided. In the conventional arrangement, these shrinking processes are accordingly perceivable and disadvantageous because they add up to considerable dimensional irregularities between the mutually far removed housing ends, at one of which: the plug-in socket is arranged. When the inner housing is centrally inserted into the outer housing, the socket will have a positional deviation corresponding to approximately half the shrinkage of the housing length. The positional deviation of the socket thus originates from the housing shrinkage, whereas the shrinkage of the socket itself is small in comparison therewith.

The merit of the invention lies in the fact that these relations are recognized and that the principle is derived there from that the positions of the inner housing and the outer housing with respect to one another had better be defined close to the location where the smallest positional differences are allowed to occur rather than by means of the outer surfaces of the two housings. Said location is the insertion opening of the plug-in socket. Accordingly, the reference elements are advantageously arranged at this socket or in the vicinity thereof. This indeed achieves that only small deviations occur at the socket itself, also in the case of major manufacturing tolerances. This is because the dimensional deviations caused by shrinking over the short distance between the insertion opening of the socket and the location of the reference elements add up at most to totals such that the narrow tolerances at the insertion opening are nevertheless reliably observed. The suitable position for arranging the reference elements may thus be defined as the location which is at a distance to the tolerance-sensitive point of the starter housing, i.e. the insertion side of the socket here, over whose length the dimensional deviations do not add up to a total which is greater than the tolerances allowed for the insertion side.

Suitable reference elements are all elements which reliably indicate a position of the housing in at least one direction and which are suitable for aligning the one housing with respect to the other housing.

In a preferred embodiment of the invention, a reference body is arranged at the tube of one of the two housings, which body in the assembled state bears on an edge of the tube arranged at the other housing. If the positions of the two housings with respect to one another can be reliably defined during assembly already, in fact, a process step involving the alignment or achievement of the desired positions of the housings with respect to one another may be omitted.

The reference bodies may be any projections, for example ridges, on a housing which can be brought to bear with their circumferential surfaces on outer edges or surfaces of recesses at the other housing, for example indentations or grooves.

In a particularly advantageous embodiment of the invention, the reference body is formed as a peg which in the assembled state enters with snug fit into an indentation or a passage in the respective other tube. This arrangement achieves that the desired relative position is securely maintained after the peg has been inserted into the associated reference element for aligning the tubes with one another. The snug fit of the peg in a passage, which preferably has a shape corresponding to the cross-section of the peg, has the advantage over the snug fit in an indentation that the positions of the tubes relative to one another are reliably maintained in each and every direction perpendicular to the longitudinal direction of the peg.

The peg may be chosen to be arranged either at the inner housing tube or at the outer housing tube, as desired. Preferably, however, the peg is arranged at the inner housing tube and enters a hole in the metal tube. The peg can be manufactured particularly easily in this embodiment because only the casting mold of the inner housing body is to be correspondingly adapted to the assembly requirements. This also renders it possible to obtain any cross-sectional shapes of the peg desired. The simplest shape is a circular cross-section for the peg, which already serves its purpose. The associated through passage in the outer housing can also be readily manufactured by stamping out or, in the case of a round peg, by drilling.

The cross-section of the peg and the shape of the associated through passage should accordingly be mutually attuned for a reliable co-operation of the two reference elements. They should snugly fit together in the final assembled state so as to assure the desired positions of the two housings immovably with respect to one another. The very absence of any play between the two reference elements, however, does not render it easy in all cases to assemble them together. An advantageous embodiment of the invention accordingly provides that the peg is tapering in shape, preferably with a rounded or pointed end. This renders it easier to insert the peg into the associated through passage of the outer housing. In addition, such a peg serving as a centering aid renders possible on the one hand a mechanized mounting without on the other hand forgoing a snug fit in the assembled state.

A certain length of the peg is absolutely necessary if it is to serve as a centering aid, in particular during automatic assembly. In the assembled state of the starter housing, however, the peg already serves its purpose with a length which corresponds to the material thickness of the outer housing at the through passage associated with the peg. In an advantageous further embodiment of the invention, therefore, the peg in the assembled state projects beyond a side of the outer housing tube facing away from the inner housing tube and is designed such that is projecting length can be removed, in particular can be broken off. The peg thus has a break-off point, for example a restriction extending along its circumference, which is situated just above the outer side of the outer housing tube facing away from the inner tube. It is ensured thereby that no reference element will form an obstruction, for example when a plug is to be inserted into the socket, during which the screening of said plug will come into contact with the screening of the starter housing via the outer side of the outer housing tube.

If this should appear to be more favorable for the manufacturing process of the assembling process, the arrangement of a peg or a ridge and of the associated through passage or groove on the outer and inner housings may also be the reverse. In an alternative embodiment of the invention, therefore, a peg or a ridge is formed at the outer housing so as to engage a through passage or a groove in the inner housing tube. This embodiment has the advantage, in particular in the case of a metal outer housing, that the peg-shaped reference element because of its stability cannot be accidentally damaged or destroyed by inexpert handing, which would render the associated housing useless for the further production process. Production wastage can thus be reduced.

Even if two reference elements co-operate, one being arranged at the inner tube and the other at the outer tube, an incorrect positioning of the two tubes relative to one another may still occur when they are mutually tilted. To avoid this, it is found to be advantageous if a plurality of co-operating reference elements are arranged at several sides of the tubes. Particularly preferred is an arrangement of two sets of two co-operating reference elements each at mutually opposed sides of the tubes. An incorrect alignment of the two tubes, in particular a mutual tilting, is securely avoided thereby.

The mutually associated reference elements need not necessarily be constructed as pegs and though passages. It may be advantageous for mounting reasons if, as an alternative to the embodiments described above, the reference elements are formed by through-passages in both tubes, which passages are brought into alignment during mounting of the starter housing and in which a fixation body can be fixed with snug fit, in particular can be wedged, for defining the positions of the two tubes with respect to one another.

The object is also achieved by means of a method of assembling a starter housing which comprises an outer and an inner housing, which outer housing is constructed in two parts, preferably with a lower part and a cover, while the starter housing comprises a plug-in socket formed by two tubes one arranged inside the other, which tubes are each connected to a respective one of the housings. In a first step of this method, the inner housing is inserted into a first part, for example into the lower part, of the outer housing. In a second step, the second part, for example the cover, of the outer housing is provided on the first part. The insertion of the inner housing into the first part and/or the provision of the second part take place such that reference elements present at the tubes co-operate with one another in the assembled state for defining the positions of the two tubes with respect to one another. This means, for example, that the position of the inner housing with respect to the outer housing is defined through co-operation of reference elements arranged in pairs both at the inner housing tube and at the outer housing tube either during the insertion of the inner housing or during the provision of the cover, or in both of these steps.

Obviously, the inner housing may alternatively be first inserted into the cover, whereupon the outer housing is closed in that the lower part is provided.

The invention accordingly departs from the usual method in which the inner housing is centered in the outer housing so as to distribute evenly over all outer sides of the inner housing the dimensional deviations of the inner housing caused by shrinkage dependent on the manufacture. It now adopts the principle of defining the position of the inner housing with respect to the outer housing as close as possible to that location where the narrowest tolerances are to be observed. This location is the insertion opening of the socket. If the referencing of the two housings with respect to one another is effected at or adjacent this socket, a high accuracy can be achieved also in the case of otherwise major deviations, because the deviations caused by shrinkage over short distances cannot add up to such high totals that the prescribed tolerances are no longer observed. The closer the co-operating reference elements are arranged to the tolerance-sensitive location, therefore, the less the dimensional deviations of the housing arising from manufacture will be disadvantageously noticeable. According to the invention, therefore, the positional definition of the two housings with respect to one another takes place as close as possible to the insertion opening of the plug-in socket.

A further advantage of the invention is that it can be ascertained already before the final assembling together of outer and inner housing whether the respective tolerances are observed at the insertion side of the socket at the given positions of the reference elements with respect to one another. Should undesirable deviations be found, that one of the two housings that causes the deviation can be taken off, and the other one can be supplied to the production process again for further processing. This can lead to a clear reduction in wastage of housing parts.

The starter housing according to the invention may be used for various types of gas discharge lamps. The lamp may then preferably form a constructional unit together with the starter housing, which unit may be incorporated, for example, as a complete component in a headlight. A major field of application of these starter housings and lamps is formed by motor vehicle headlights. In addition, however, they may be used in other lighting devices.

Figure 2:
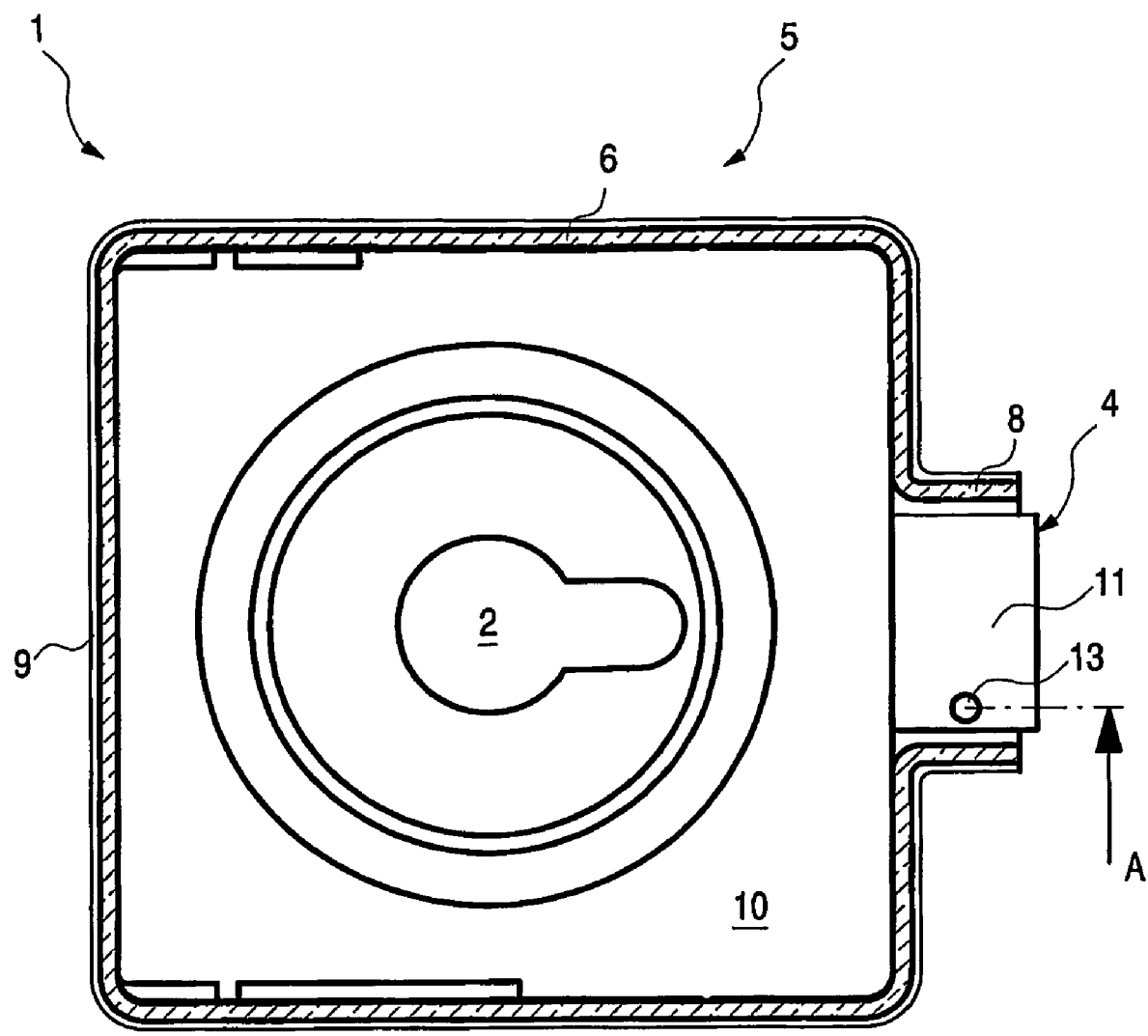
Figure 3:
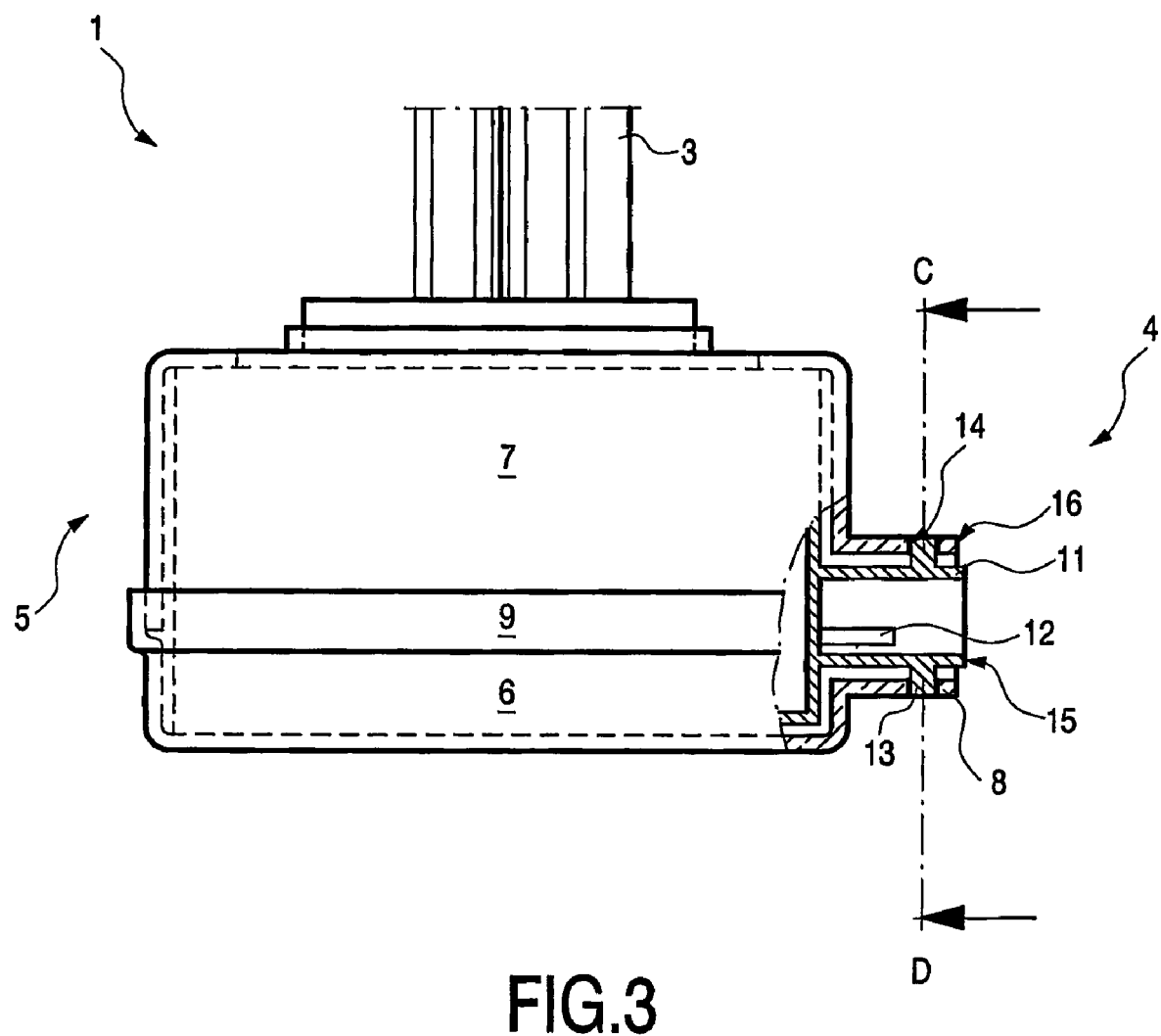
Figure 4:
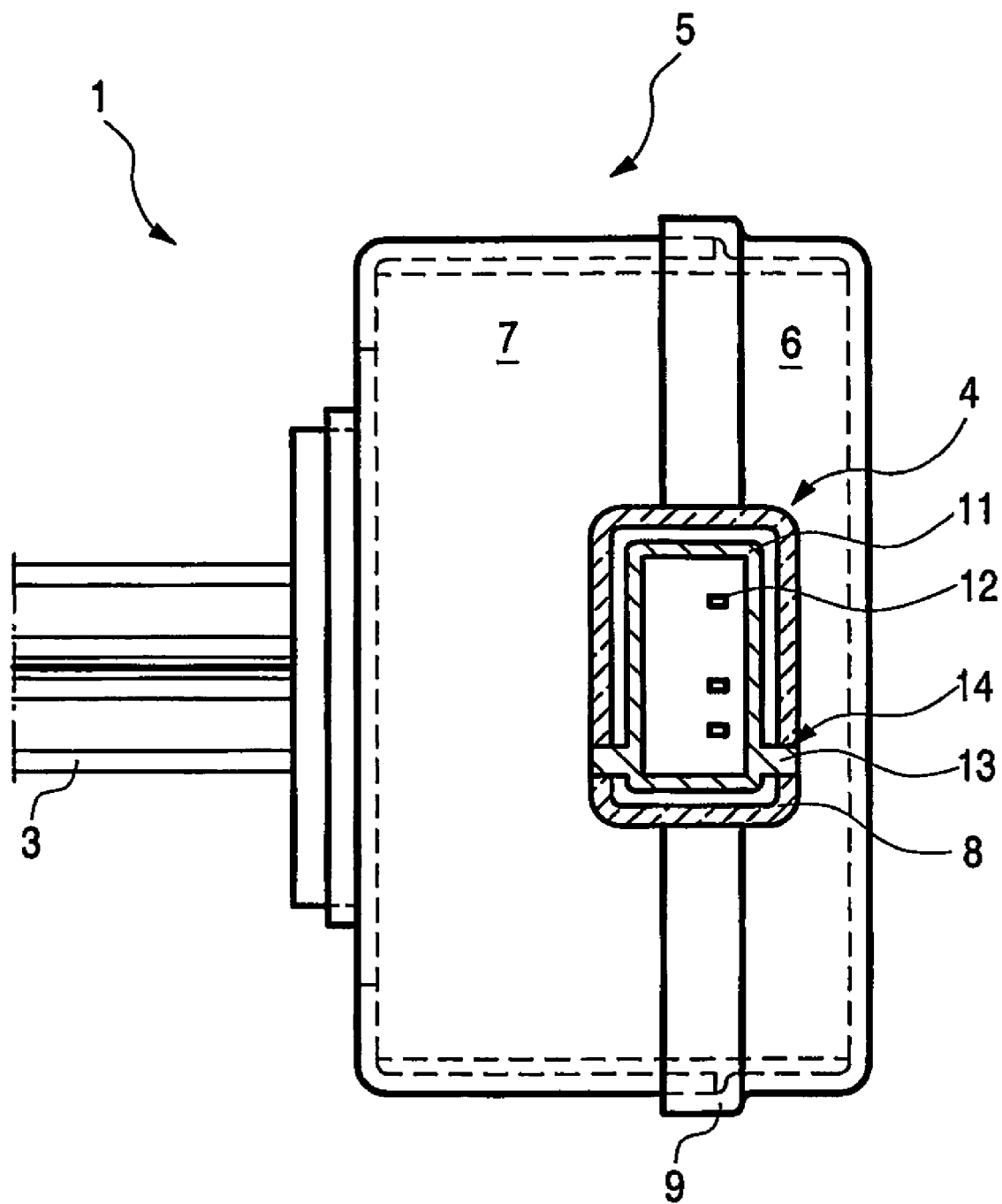

The invention will now be explained in more detail with reference to the appended drawings and an embodiment. Similar functional units have been given the same reference numerals in the Figures, in which FIG. 1 is a plan view of a starter housing according to the prior art, FIG. 2 is a plan view of a starter housing in an embodiment of the invention, FIG. 3 is a side elevation of the starter housing of FIG. 2 with a lamp inserted therein, and a partial cross-section through a plug-in socket taken on a line A in FIG. 2, and FIG. 4 is a side elevation of the starter housing of FIG. 2 with a partial cross-section of a plug-in socket taken on a line C-D in FIG. 3.

FIG. 1 is a diagrammatic plan view of an opened starter housing A according to the prior art. It serves as a holder for a gas discharge lamp (not shown in FIG. 1) for a motor vehicle, which lamp is inserted into a holder opening B. The connection of the lamp to the electrical circuit of the vehicle is achieved via a socket C at the starter housing A, into which a mating plug can be inserted. An electronic circuit is accommodated in the starter housing A, which circuit is necessary for the operation, in particular the starting phase, of the gas discharge lamp. The lamps and their electronic circuits must be electromagnetically screened because gas discharge lamps on account of their construction emit electromagnetic interference radiation which may interfere with the other electronics of the motor vehicle. The starter housing A accordingly comprises a metal outer housing D as a screening, to which an outer housing tube E is integrally connected as part of the socket C. The outer housing D is shown without a cover so as to render it possible to view its interior. The outer housing D is advantageously manufactured in a deep-drawing process.

An inner housing F comprising the holder opening B and an inner housing tube G is arranged in the outer housing D. The outer housing tube E and the inner housing tube G together form the plug-in socket C. The inner housing F is manufactured from synthetic resin in an injection-molding process. It is retained in the outer housing D in that it is enclosed with clamping fit between the side walls of the outer housing D. For this purpose, ridges H are provided on outer surfaces of the inner housing F, positioning the inner housing F concentrically in the outer housing D.

Both the deep-drawing process for manufacturing the outer housing D and the injection-molding process with which the inner housing F is produced, however, lead to unpredictable fluctuations in the housing dimensions which differ from batch to batch, in particular for the inner housing F but also for the outer housing D. FIG. 1 shows the contours of an inner housing F' with deviating dimensions in broken lines by way of example, which deviations are shown on an exaggerated scale for greater clarity. The inner housing F' has smaller dimensions than the inner housing F with respect to the outer housing D in all directions. It has shrunk in comparison with the inner housing F. The ridges H' arranged on the outer surfaces of the inner housing F', therefore, are less strongly deformed than the ridges H and bend the side surfaces of the outer housing D less strongly in outward direction. This means that the ridges H' still provide a centered clamping fit of the inner housing F' in the outer housing D in spite of the dimensional deviations of the inner housing F; such that the holder opening B is centrally arranged in the starter housing A.

In this central position, however, the greatest dimensional deviations occur at the outer sides of the inner housing F'. Since the inner housing tube G' is arranged at an end face of the inner housing F', it will have a considerable longitudinal deviation with respect to the inner housing tube G. This has the result that the inner housing tube G' does not lie flush with the outer housing tube E at an insertion side I of the socket C, but remains behind the tube E. This leads to an imperfect contacting of the plug (not shown) in the socket C and should accordingly be avoided.

An embodiment of a starter housing 1 according to the invention that eliminates this problem is shown in FIGS. 2 to 4. In this starter housing 1, again, a holder opening 2 shown in FIG. 2 serves to accommodate a gas discharge lamp 3 that is only partly shown in FIGS. 3 and 4. The current supply for the electronics present in the starter housing 1 may again be achieved via a socket 4 at an outer side of the starter housing 1.

The starter housing 1 again comprises an outer housing 5 of metal, which is subdivided into a bottom 6 and a cover 7. FIG.

2 only shows the bottom 6 in plan view, while FIGS. 3 and 4 show both bottom 6 and cover 7 in two side elevations. Components of an outer housing tube 8 are formed integrally both with the bottom 6 and with the cover 7, which tube forms the screening for the socket 4. A collar 9 is also present as part of the bottom 6, which collar grips over edge portions of the side walls of the cover 7 in the assembled state and is detachably secured there.

FIG. 2 is a plan view of the starter housing 1 without the cover 7 of the outer housing 5. An inner housing 10 of synthetic resin is inserted in the bottom 6, and an inner housing tube 11 is arranged at an outer side of said inner housing and is surrounded by a portion of the outer housing tube 8 that forms part of the bottom 6. Contacts 12 (shown in FIGS. 3 and 4) are provided in the inner housing tube 11 for contacting a plug connector (not shown). The outer housing tube 8 and the inner housing tube 11 together form the plug-in socket 4 of the starter housing 1. When a mating plug is inserted into the socket 4, it will make contact in the socket 4 first with the contacts 12 and then also with the outer housing tube 8. The contacts 12 serve for the electrical supply of the lamp 3, while the contacting between the outer housing tube 8 and the associated contact of the plug connector closes the electromagnetic screening of the system formed by the gas discharge lamp 3, the starter housing 1, and the supply lines.

Two mutually opposed pegs 13 engaging corresponding holes 14 in the outer housing tube 8 are arranged on the outer sides of the inner housing tube 11 facing the outer housing tube 8. The pegs 13 define the position of the inner housing tube 11 relative to the outer housing tube 8. They achieve that an end face 15 of the inner housing tube 11 comes to lie in front of an end face 16 of the outer housing tube 18, as much as possible, as viewed against the insertion direction of a plug connector. This arrangement, or a flush arrangement of the two end faces 15, 16, is necessary so as to safeguard a reliable contacting of the plug in the socket. A retracted position of the end face 15 behind the end face 16 is to be avoided in all cases.

The arrangement of the pegs 13 at the inner housing tube 11 safeguards the required relative position of the outer housing tube 8 and the inner housing tube 11 also in the case of dimensional deviations of the inner housing tube 11. If the dimensions of the inner housing 11 show deviations owing to shrinkage in manufacture such that the inner housing 11 has a total size smaller than that shown, then a central arrangement of the inner housing 10 in the outer housing 5 according to the prior art would cause the end face 15 to lie behind the end face 16. The pegs 16, however, ensure here that the deviations in outer dimensions of the inner housing have no appreciable influence on the positioning the inner housing tube 11 relative to the outer housing tube 8. This is because dimensional deviations owing to shrinkage hardly have any effect in the short distance between the end faces 15, 16 and the pegs 13 that define their relative positions. As a result, the correct positioning to the two end faces 15, 16 with respect to one another is not jeopardized also in the case of such a deviation. The required alignment remains intact.

It is finally noted once more that the housing disclosed in the Figures and in the description is merely an example which may be varied within a wide range by those skilled in the art without departing from the scope of the invention. Thus the Figures show, for example, merely the case in which the dimensions of the inner housing show deviations. The arrangement according to the invention obviously also achieves its object in the case of dimensional deviations of the outer housing. Furthermore, for example, the inner housing tube shown with a rectangular shape in the embodiment may have any other shape desired, for example a cylindrical shape. It is furthermore noted for completeness' sake that the use of the indefinite article "a" and "an" does not exclude the presence of a plurality of the relevant items, and that the use of the verb "comprise" does not exclude the existence of further elements.

The invention claimed is:

1. A starter housing for a gas discharge lamp comprising an outer and an inner housing arranged one inside the other in an assembled state of the starter housing, the outer housing comprising a metal layer for electromagnetic screening of the inner housing, and
an inner housing tube arranged at the inner housing, which, in the assembled state, is surrounded by an outer housing tube arranged at the outer housing, said inner housing tube and outer housing tube together forming a plug-in socket, wherein
reference elements are arranged at the respective tubes of both housings such that they co-operate in the assembled state for defining the positions of the two tubes with respect to one another, the housing further comprising a reference body arranged at one of the inner and outer tubes and bearing, in the assembled state, on an edge of the other of the inner and outer tubes.

2. The starter housing of claim 1, wherein the reference body is formed as a peg snugly fitting into a passage or an indentation in the other tube.

3. The starter housing of claim 2, wherein the peg is arranged at the inner housing tube and enters a hole in the outer housing tube.

4. The starter housing of claim 2, wherein the peg is conical in shape.

5. The starter housing of claim 3, wherein the peg in the assembled state projects beyond a side of the outer housing tube that faces away from the inner housing tube and is designed such that its projecting length is removable.

6. The starter housing of claim 2, wherein a peg or a ridge is formed at the outer housing so as to engage a through passage or a groove in the inner housing tube.

7. The starter housing of claim 1, wherein the reference elements are formed by through passages in the tubes, which passages can be brought into alignment during mounting of the starter housing and in which a fixation body can be fixed with snug fit for defining the positions of the tubes with respect to one another.

8. A lamp with a starter housing as claimed in claim 1.

9. A lighting device comprising a lamp having a starter housing as claimed in claim 1.

* * * * *